United States Patent

Kuriwaki et al.

[11] Patent Number: 6,097,367
[45] Date of Patent: Aug. 1, 2000

[54] DISPLAY DEVICE

[75] Inventors: Futoshi Kuriwaki; Kazuya Yamaguchi, both of Kagoshima-ken, Japan

[73] Assignee: Matsushita Electric Industrial Co., Ltd., Osaka, Japan

[21] Appl. No.: 08/925,910

[22] Filed: Sep. 8, 1997

[30] Foreign Application Priority Data

Sep. 6, 1996 [JP] Japan .................................. 8-236391

[51] Int. Cl.⁷ .................................................. G09G 1/28
[52] U.S. Cl. .......................... 345/150; 345/82; 345/83; 345/88; 345/152
[58] Field of Search .............................. 345/150, 82, 83, 345/88, 152

[56] References Cited

U.S. PATENT DOCUMENTS

| | | | |
|---|---|---|---|
| 4,642,619 | 2/1987 | Togashi | 340/701 |
| 4,726,059 | 2/1988 | Havel | 379/354 |
| 4,800,375 | 1/1989 | Silverstein et al. | 345/152 |
| 4,824,269 | 4/1989 | Havel | 400/704 |
| 4,934,852 | 6/1990 | Havel | 400/704 |
| 5,184,114 | 2/1993 | Brown | 345/150 |
| 5,278,542 | 1/1994 | Smith et al. | 345/150 |
| 5,561,365 | 10/1996 | Havel | 324/115 |
| 5,732,205 | 3/1998 | Astle | 395/131 |
| 5,929,843 | 7/1999 | Tanioka | 345/150 |

FOREIGN PATENT DOCUMENTS

| | | |
|---|---|---|
| 7-175423 | 7/1995 | Japan . |
| 82827 | 11/1986 | Taiwan . |

OTHER PUBLICATIONS

European Search Report corresponding to application No. EP 97 11 5410 dated Mar. 5, 1998.

Office Action from corresponding Taiwan Patent Application No. 86112841 dated Nov. 25, 1999, with English translation, 4 pages total.

Primary Examiner—William A. Cuchlinski, Jr.
Assistant Examiner—Marthe Marc-Coleman
Attorney, Agent, or Firm—Ratner & Prestia

[57] ABSTRACT

A display device includes: a light-emitting block including a plurality of light-emitting elements for emitting N number of different basic colors; an input circuit for receiving an input data representing a first color, a second color and a third color; a converter for converting the input data into an output data representing N number of basic colors; and a controller for controlling ON/OFF states of the plurality of light-emitting elements according to the output data. N is an integer of 4 or higher.

6 Claims, 11 Drawing Sheets

DISPLAY DEVICE

BACKGROUND OF THE INVENTION

1. Field of the Invention

The present invention relates to a light-emitting diode display device (hereinafter, simply referred to as an "LED display device") having a display area where a plurality of light-emitting blocks, each corresponding to one dot, are arranged in a matrix.

2. Description of the Related Art

In order to obtain an LED display device capable of displaying a plurality of colors so as to realize, for example, a full-color display or a multi-color display, each of light-emitting blocks, which corresponds to one dot of the LED display device, needs to emit at least light of three basic colors, namely, red (R), green (G) and blue (B) light.

In a conventional LED display device, the light-emitting blocks each include three light-emitting diodes (hereinafter, simply referred to as "LEDs") corresponding to R signals, G signals and B signals, respectively. Each of such LEDs is associated with an input processor for receiving one of the RGB signals, a color arithmetic circuit for adjusting colors and an ON/OFF controller for controlling the ON/OFF state of a display circuit. In other words, the conventional LED display device includes LEDs each having a three-unit structure corresponding to the RGB signals.

However, conventional LEDs have insufficient light-emitting characteristics for displaying a color close to a pure (monochromatic) green color. Therefore, each light-emitting block is formed to consist of a red LED, a blue LED and a yellow-green LED, where the yellow-green LED is driven by the input processor, the color arithmetic circuit and the ON/OFF controller such as to emit light having a color closer to a pure green color.

Although red and blue colors obtained by such a conventional LED display device can stand comparison with those obtained in a television, a CRT or the like, color reproducibility of the conventional LED is poor in a green color region.

In theory, it is possible to produce a green LED capable of emitting pure green light. However, this would involve a large amount of cost and trouble.

SUMMARY OF THE INVENTION

According to one aspect of the present invention, a display device includes: a light-emitting block including a plurality of light-emitting elements for emitting N number of different basic colors; an input circuit for receiving an input data representing a first color, a second color and a third color; a converter for converting the input data into an output data representing N number of basic colors; and a controller for controlling ON/OFF states of the plurality of light-emitting elements according to the output data. N is an integer of 4 or higher.

In one embodiment of the present invention, a color production region of the light-emitting block on a chromaticity diagram has a plurality of regions defined by M number of reference colors. Each of the M number of reference colors are obtained based on at least one of the N number of basic colors. The converter includes a circuit for selecting one of the plurality of regions in accordance with the input data and a circuit for generating the output data based on at least one of the reference colors corresponding to the selected region.

In another embodiment of the present invention, the plurality of regions covers a color production region of a CRT.

In still another embodiment of the present invention, at least one of the M number of reference colors is different from the N number of basic colors.

In yet another embodiment of the present invention, the N number of light-emitting elements are four light-emitting diodes which emit light of the basic colors, namely, red, blue, yellow-green and blue-green, respectively.

In still another embodiment of the present invention, M is an integer of 4 or higher.

Thus, the invention described herein makes possible the advantages of providing an LED display device having enhanced color reproducibility in a green color region.

This and other advantages of the present invention will become apparent to those skilled in the art upon reading and understanding the following detailed description with reference to the accompanying figures.

DESCRIPTION OF THE PREFERRED EMBODIMENTS

Terms and notations used in the description of examples of the present invention are defined as follows.

A "basic color" refers to a color of light emitted from a light-emitting element which is a minimum unit of a display device. Specifically, in the following description of the examples of the present invention, the "basic color" refers to a color of light emitted from an LED. The "basic colors" are represented by notations. For example, $R_{LED}$ is a color of light emitted from a red LED, and $R_{CRT}$ is a red color displayed by one pixel of a CRT. Similar notations are used for representing other basic colors.

A "color production region" refers to a range of colors produced by a display device when illustrated on a CIE chromaticity diagram.

A "reference color" is a color that defines the "color production region" of the display device. A "reference color" may be the same as a "basic color" (i.e., a "reference color" may have the same chromaticity coordinates as those of a "basic color") or may be a "color" that is obtained by combining at least two "basic colors". The "reference color" is represented by a notation in which a letter representing a color is accompanied by a subscript "REF" (e.g., $R_{REF}$).

Hereinafter, the present invention will be described by way of illustrative examples with reference to the accompanying drawings.

EXAMPLE 1

Figure 1:
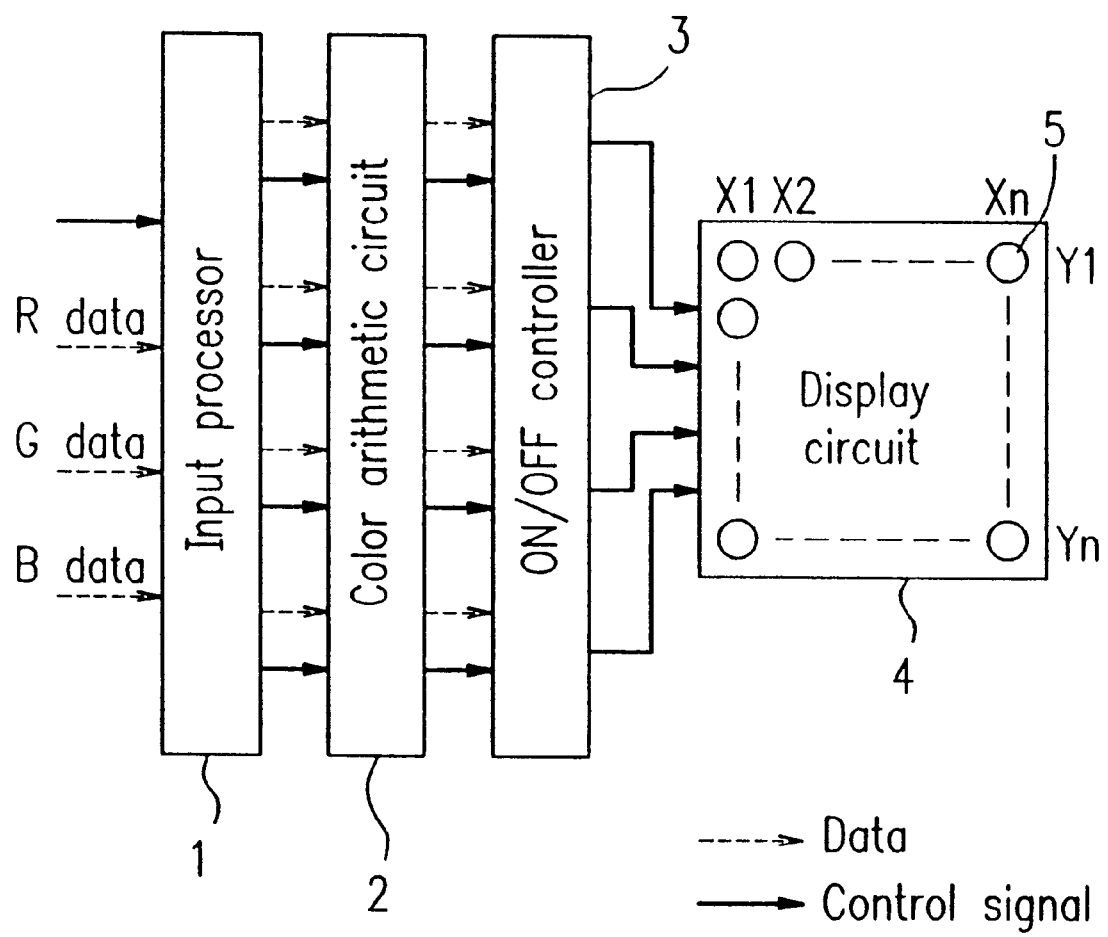
FIG. 1 is a schematic diagram showing a structure of a display device according to a first example of the present invention.

FIG. 1 is a schematic diagram showing a structure of an LED display device according to a first example of the present invention. The LED display device according to the first example of the present invention includes: an input processor 1 for receiving a control signal and RGB data ($R_{CRT}$, $G_{CRT}$ and $B_{CRT}$) (the input data are the same as the conventional input data); a color arithmetic circuit 2 for converting the RGB data received by the input processor 1 into data corresponding to four colors, namely, red ($R_{LED}$), blue ($B_{LED}$), yellow-green ($YG_{LED}$) and blue-green ($BG_{LEG}$); an ON/OFF controller 3 for controlling ON/OFF states of each LED included in each light-emitting block 5 (each dot); and a display circuit 4 in which the light-emitting blocks 5 are arranged along a x-direction and a y-direction so as to form a matrix.

Figure 2A:
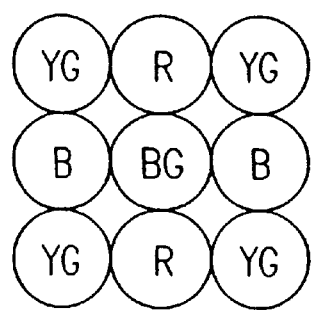
FIGS. 2A to 2D are schematic views showing examples of arrangements of LEDs included in one light-emitting block.

In each light-emitting block 5, LEDs are arranged, for example, in a form of a 3×3 lattice as shown in FIG. 2A in a point symmetric manner where a blue-green LED BG is placed at the center. In FIG. 2A, R, B, YG and BG each represent types of the LEDs. According to the first example, in order to enhance the color reproducibility in the green region, yellow-green LEDs YGs are arranged at the four corners so as to surround the blue-green LED BG.

Figure 3:
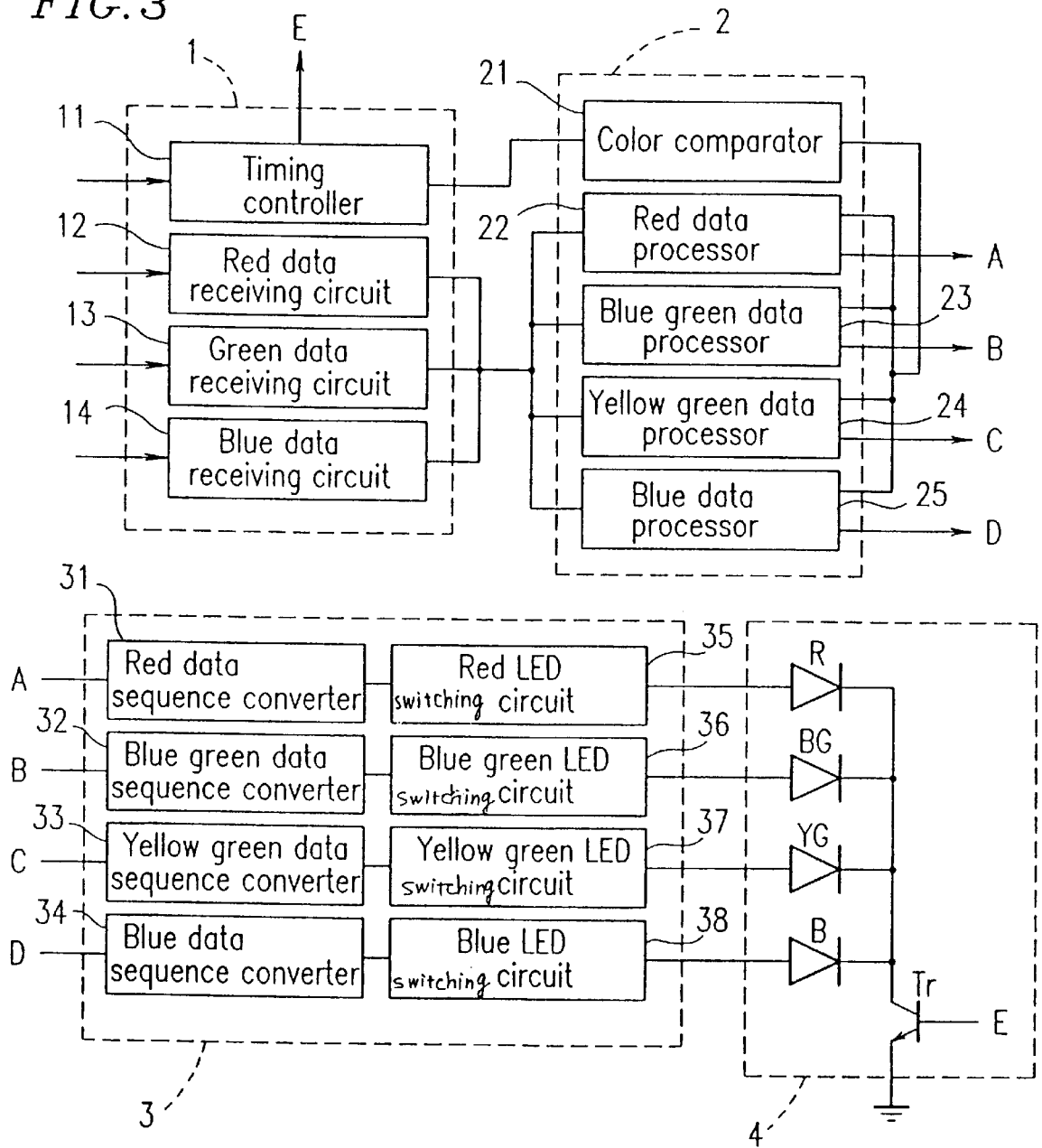
FIG. 3 is a schematic view showing a specific structure of the display device according to the first example of the present invention.

FIG. 3 is a schematic diagram showing a specific structure of the LED display device according to the first example of the present invention shown in FIG. 1. The input processor 1 includes a timing controller 11, a red data receiving circuit 12, a green data receiving circuit 13 and a blue data receiving circuit 14. The timing controller 11 controls the timing of the ON/OFF states of each LED in accordance with an input control signal. The red data receiving circuit 12, the green data receiving circuit 13 and the blue data receiving-circuit 14 receive R data, G data and B data, respectively. In other words, the input processor 1 has a three-unit structure corresponding to the RGB data.

The color arithmetic circuit 2 includes a color comparator 21, a red data processor 22, a blue-green data processor 23, a yellow-green data processor 24 and a blue data processor 25. The color comparator 21 converts RGB data received by the input processor 1 into data representing a combination ratio of four colors which are to be produced by the LEDs, i.e., $R_{LED}$, $B_{LED}$, $YG_{LED}$ and $BG_{LED}$ (i.e., an emission intensity ratio of the four LEDs). The red data processor 22, the blue-green data processor 23, the yellow-green data processor 24 and the blue data processor 25 process the converted data corresponding to the four colors, respectively. In other words, the color arithmetic circuit 2 has a four-unit structure corresponding to the converted data representing the four colors (i.e., four basic colors).

The ON/OFF controller 3 includes a red data array converter 31, a blue-green data array converter 32, a yellow-green data array converter 33 and a blue data array converter 34. The ON/OFF controller 3 further included a switching circuit 35 for the red LED, a switching circuit 36 for the blue-green LED, a switching circuit 37 for the yellow-green LED and a switching circuit 38 for the blue LED. The four data array converters obtained by the color arithmetic circuit 2 into series-strung data, respectively. Moreover, the four LED switching circuits 35 to 38 switch the red LED R, the blue-green LED BG, the yellow-green LED YG and the blue LED B to an ON state based on each of the serial-strung data representing the four colors after controlling the level of each LED. Thus, the ON/OFF controller 3 has a four-unit structure corresponding to the converted data of the four basic colors.

A switching element Tr of the display circuit 4 connected with each LED is switched ON/OFF by the output from the timing controller 11, thereby controlling the light-emitting time for each period of each LED.

When data corresponding to the basic colors (RGB data) are input into the LED display device having the above-described structure in the same manner as in the case of the conventional LED display device, a display with excellent color reproducibility can be obtained in the green color region by the light-emitting LEDs of the four colors ($R_{LED}$, $B_{LED}$, $YG_{LED}$ and $BG_{LED}$) in the light-emitting blocks 5.

Figure 4:
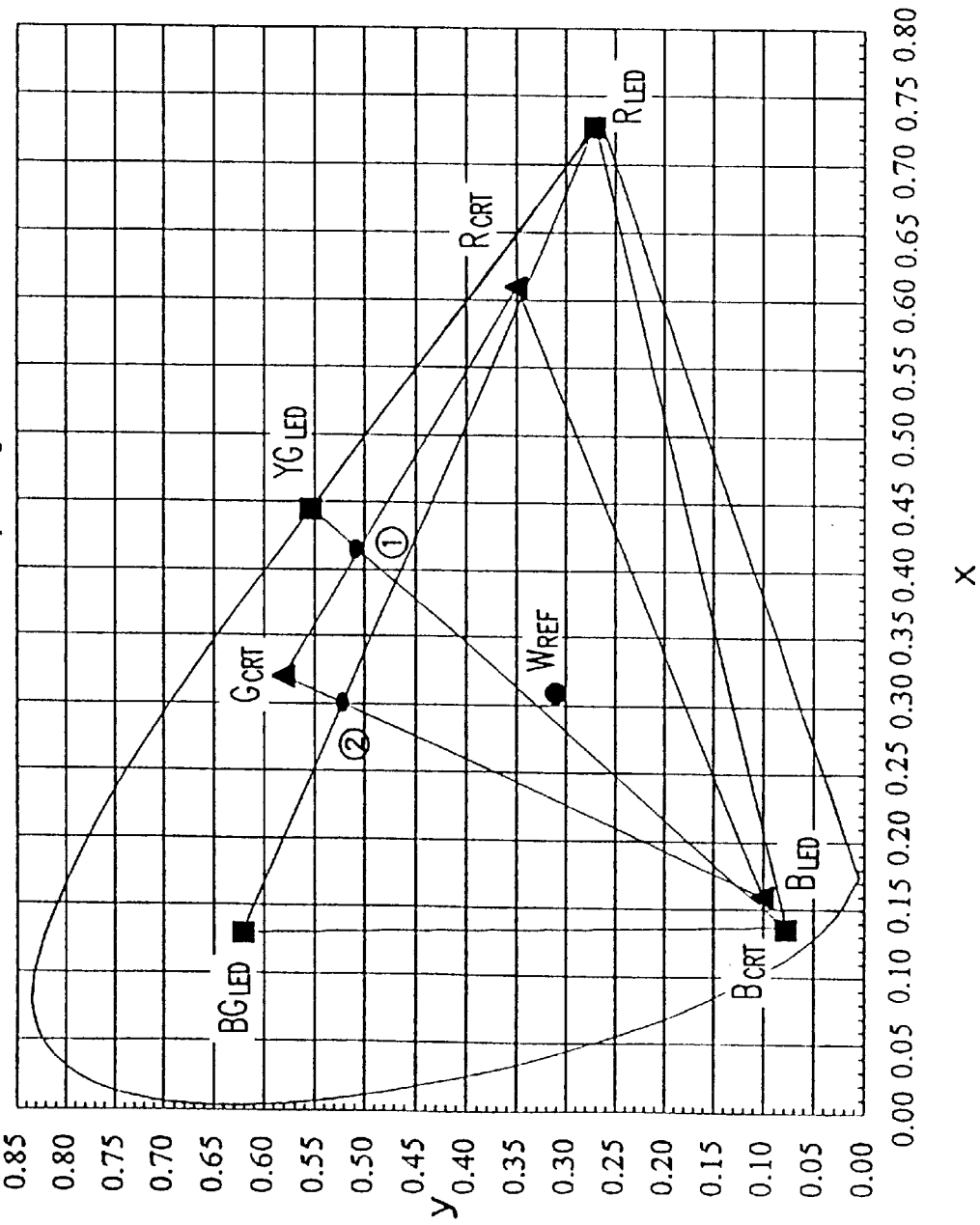
FIG. 4 is a CIE chromaticity diagram showing a color production region of a display device according to the present invention.

Hereinafter, the color reproducibility of the LED display device will be described with reference to FIG. 4. FIG. 4 is a chromaticity diagram where all colors can be expressed within a curved region. Each color is specified by coordinates with respect to the vertical and horizontal axes of the chromaticity diagram.

A point $W_{REF}$ shown at the center of the curved region represents a white color. A region to the right of the point $W_{REF}$ is a red color region. A region to the upper left of the point $W_{REF}$ is a green color region and a region to the lower left to the point $W_{REF}$ is a blue color region.

Since a conventional light-emitting block or an LED display device with conventional light-emitting blocks consists of red, blue and yellow-green LEDs as described above, colors are produced only within a triangle region having vertices at $R_{LED}$, $B_{LED}$ and $YG_{LED}$ in FIG. 4. An NTSC (National Television System Committee) system television can produce colors within a triangle region having its vertices at $R_{CRT}$, $G_{CRT}$ and $B_{CRT}$.

Therefore, the conventional light-emitting block is considered inferior to the NTSC system television in color reproducibility for a triangle region having its vertices at $YG_{LED}$, $B_{LED}$ and $G_{CRT}$. In other words, the conventional light-emitting block has a large area in the green region where it is impossible to produce color.

The light-emitting block 5 in the LED display device according to the present invention is provided with the red LED, the blue LED, the yellow-green LED and the blue-green LED. As a result, the light-emitting block 5 can display colors within a square region having vertices at $R_{LED}$, $B_{LED}$, $BG_{LED}$ and $YG_{LED}$.

When the light-emitting block 5 is compared to the conventional light-emitting block, the possible display region (on the chromaticity diagram) is expanded for a triangle region having its vertices at $YG_{LED}$, $BG_{LED}$ and $B_{LED}$, thereby enhancing color reproducibility in green and blue color regions.

Figure 2B:
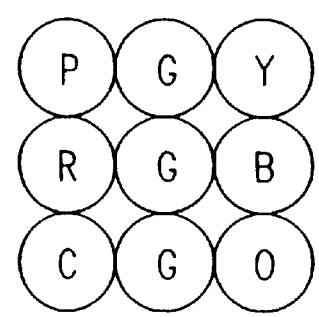
Figure 2C:
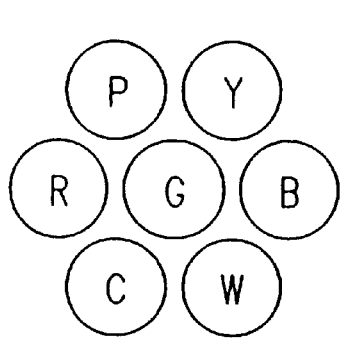
Figure 2D:
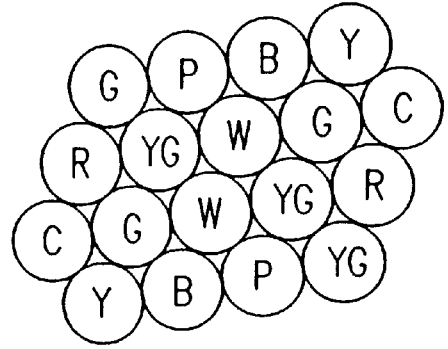

FIGS. 2B through 2D show other exemplary structures of a light-emitting block applicable in the present invention. In the case of FIG. 2B, the light-emitting block 5 consists of LEDs corresponding to seven colors, namely, red (R), green (G), blue (B), yellow (Y), orange (O), purple (P) and light blue (C). In this case, the color arithmetic circuits 2 and the ON/OFF controllers 3 previously described with reference to FIGS. 1 and 3 are provided so as to form a seven-unit structure in each light-emitting block.

In a light-emitting block shown in FIG. 2C, a green LED is placed at the center, and LEDs of 6 colors, namely, Y, B, W, C, R and P are placed so as to surround the green LED. The six LEDs and the green LED G are equally separated from each other.

A light-emitting block shown in FIG. 2D includes 18 LEDs. The 18 LEDs are formed of LEDs of 8 colors, namely, G, P, B, Y, R, YG, W and C.

EXAMPLE 2

Hereinafter, an LED display device according to a second example of the present invention will be described.

Figure 5:
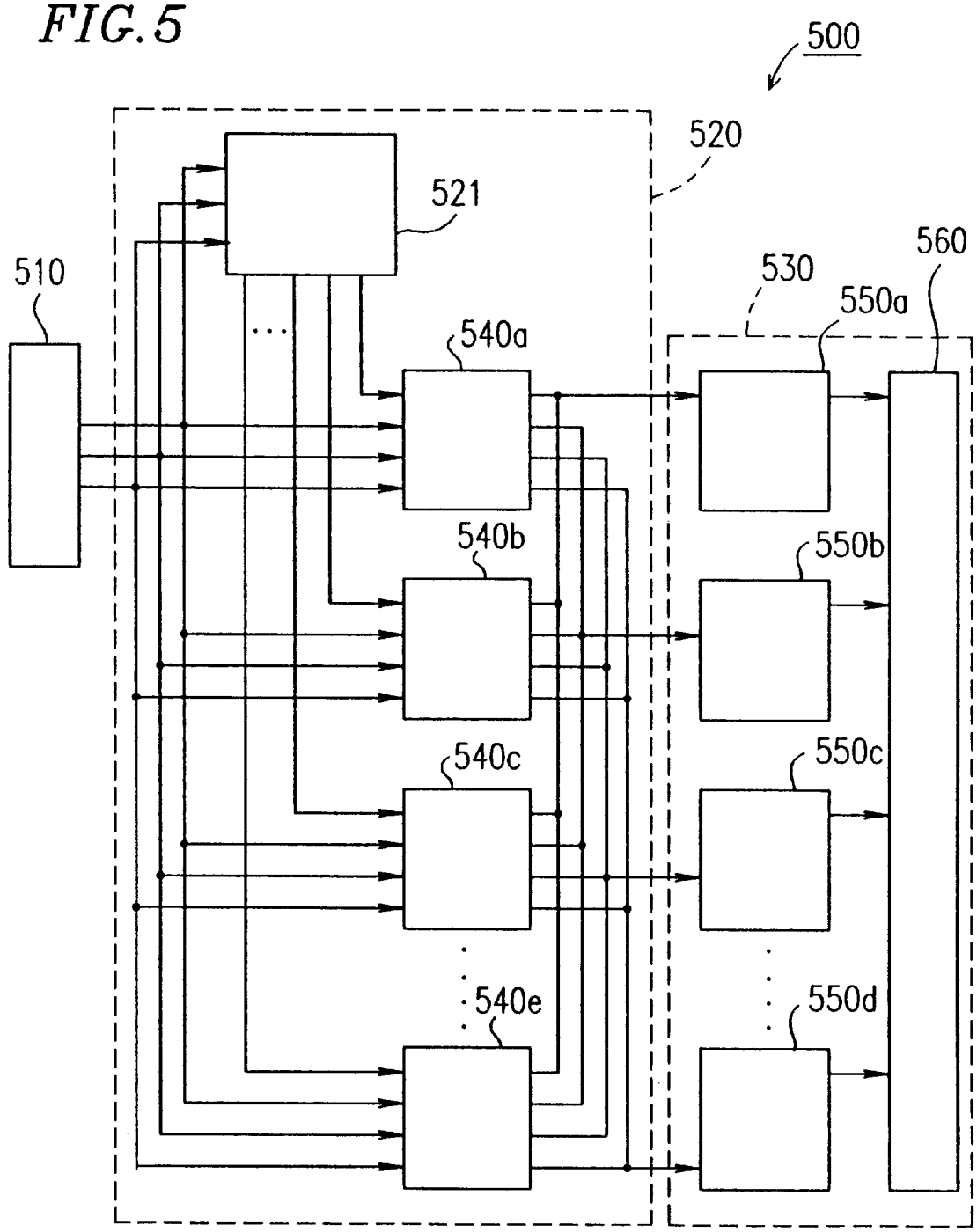
FIG. 5 is a schematic diagram showing circuits included in a display device according to a second example of the present invention.

As shown in FIG. 5, a circuit section 500 includes an input processor 510, a color arithmetic circuit 520 and an ON/OFF controller 530. The input processor 510 receives an input data representing a combination ratio of $R_{CRT}$, $G_{CRT}$ and $B_{CRT}$ and outputs the input data to the color arithmetic circuit 520. The color arithmetic circuit 520 converts the input data into a data representing the combination ratio of the four basic colors and outputs the data to the ON/OFF controller 530. The ON/OFF controller 530 controls ON/OFF states of each of the four light-emitting diodes included in a light-emitting block 5 in accordance with the received output data.

Figure 6:
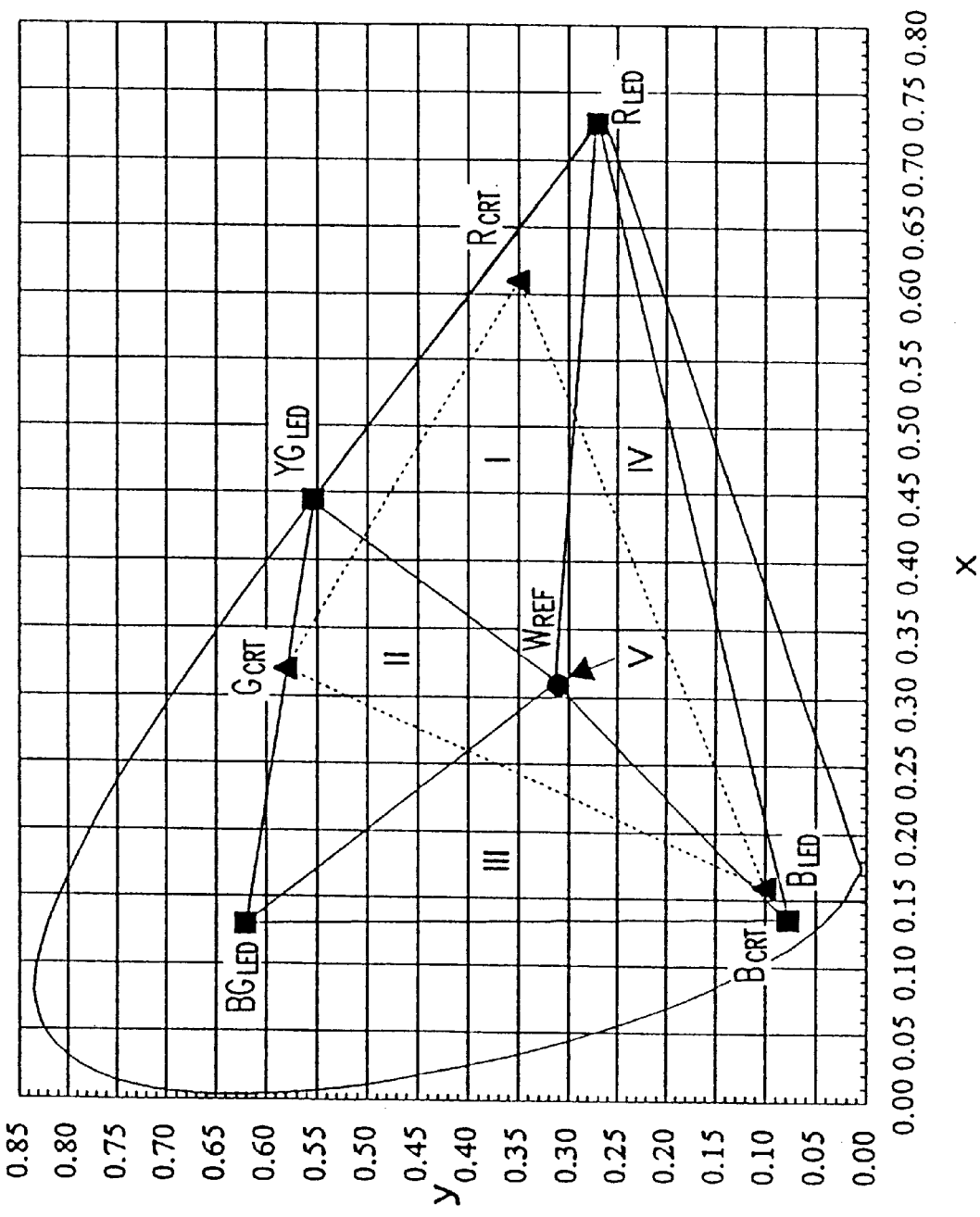
FIG. 6 is a CIE chromaticity diagram showing a color production region of the display device according to the second example of the present invention.

Next, functions and structure of the color arithmetic circuit 520 will be described. The color arithmetic circuit 520 uses four basic colors as four reference colors so as to define a color production region of the light-emitting block. In addition to the four reference colors, a white color represented by RGB data having equal ratio (i.e., $R_{CRT}:G_{CRT}:B_{CRT}=1:1:1$) is also considered as a reference color $W_{REF}$. As shown in FIG. 6, the color arithmetic circuit 520 divides the color production region so as to define four regions I to IV each defined by $W_{REF}$ and two basic colors. Furthermore, point $W_{REF}$ itself is also considered as a region, i.e., a region V.

The color arithmetic circuit 520 includes five region-arithmetic circuits 540a to 540e and a color comparator 521. The color comparator 521 compares three signals forming the input data. By doing so, the color comparator 521 determines which one of the regions I to V shown in FIG. 6 is a region where a color represented by the input data belongs.

Each of the region-arithmetic circuits 540a to 540e is formed so as to correspond to each of the regions I to V, respectively. Each of the region-arithmetic circuits 540a to 540e stores formulae for converting the RGB signals (the input data) into a data representing a combination ratio of the four basic colors. The region-arithmetic circuits 540a to 540e provide an output data for the four basic colors based on the formulae. These formulae are determined for each of the regions I to V.

Hereinafter, an example of operations performed by the color comparator circuit 521 and the region-arithmetic circuits 540a to 540e will be described. In the case where the color comparator 521 determines that a color represented by an input data belongs to region I, the color comparator 521 selects and activates the region-arithmetic circuit 540a corresponding to region I. Then, the region-arithmetic circuit 540a converts the input data from the input processor 510, which represents a first color element, a second color element and a third color element (i.e., $R_{CRT}$, $G_{CRT}$, and $B_{CRT}$) into an output data representing a combination ratio of four basic colors, namely, $R_{LED}$, $BG_{LED}$, $YG_{LED}$ and $B_{LED}$. Although the $R_{CRT}$ signal, the $G_{CRT}$ signal and $B_{CRT}$ signal are input to all of the region-arithmetic circuits 540a to 540e, it is only the region-arithmetic circuit 540a selected by the color comparator 521 that performs the calculation.

As shown in FIG. 6, $YG_{LED}$ lies between $R_{CRT}$ and $G_{CRT}$, and $BG_{LED}$ lies between $G_{CRT}$ and $B_{CRT}$. $YG_{LED}$ is assigned to a particular intermediate color (represented by a particular balance of the value of the input RGB signals) between $R_{CRT}$ and $G_{CRT}$ in FIG. 6. Similarly, $BG_{LED}$ is assigned to a particular intermediate color between $G_{CRT}$ and $B_{CRT}$ in FIG. 6. Accordingly, when a data representing either one of the above-mentioned particular intermediate colors is input to the color arithmetic circuit 520, the color arithmetic circuit 520 outputs an output data such that only the assigned $YG_{LED}$ or $BG_{LED}$ are produced. Moreover, a combination ratio of the four basic colors (i.e., an emission intensity ratio of the four LEDs) for producing $G_{CRT}$ is also assigned by a particular input data.

The output data from the color arithmetic circuit 520 is sent to four output circuits 550a to 550d each of which corresponding to $R_{LED}$, $BG_{LED}$, $YG_{LED}$ and $B_{LED}$, respectively. The output data from the output circuit 550a to 550d are, thereafter, input to an output timing circuit 560. The output timing circuit 560 converts the output data into a signal form for operating the LED display device and outputs the signal to each of the LEDs, thereby controlling the ON/OFF of the four LEDs.

The region-arithmetic circuits 540a to 540e have a red data arithmetic circuit 22, a blue-green data arithmetic circuit 23, a yellow-green data arithmetic circuit 24 and a blue data arithmetic circuit 25 shown in FIG. 3.

Accordingly, when input signals representing each color of a sequence of colors $R_{CRT}$-$G_{CRT}$-$B_{CRT}$-$R_{CRT}$ are input to the circuit section 500 having the above-described structure in this order, the four LEDs will sequentially emit light of colors $R_{LED}$-$YG_{LED}$-$G_{LED}$-$BG_{LED}$-$B_{LED}$-$R_{LED}$ in this order. In the case where an input data corresponds to a color that lies between one of LED colors and $W_{REF}$, the region-arithmetic circuits for each region re-calculates a combination ratio (an emission intensity ratio) of the basic colors based on the combination ratio of $W_{REF}$ and each of the colors of the four LEDs (i.e., basic colors). Finally, the light-emitting blocks 5 produces a color based on the resultant output signal obtained by re-calculation.

EXAMPLE 3

The display devices according to the first and second examples of the present invention produce colors that may not be obtained in the case of CRT. Such colors may appear unnatural to eyes accustomed to CRT. In the display devices according to the first and second examples of the present invention, each of the region-arithmetic circuits 540a to 540e performs only a certain calculation. Specifically, the region-arithmetic circuits 540a to 540e either output a certain data in response to an input data, or produce a color by combining the four colors (the basic colors). Therefore, in the case where colors of the basic colors $R_{LED}$, $YG_{LED}$, $BG_{LED}$ and $B_{LED}$ are different in different light-emitting blocks 5 due to a variation in LEDs caused during the production process thereof, colors obtained by combining the basic colors $R_{LED}$, $YG_{LED}$, $BG_{LED}$ and $B_{LED}$ also become different in different light-emitting blocks 5 or display devices. Such an effect is especially significant at the vicinity of boundaries of the color production regions.

Figure 7:
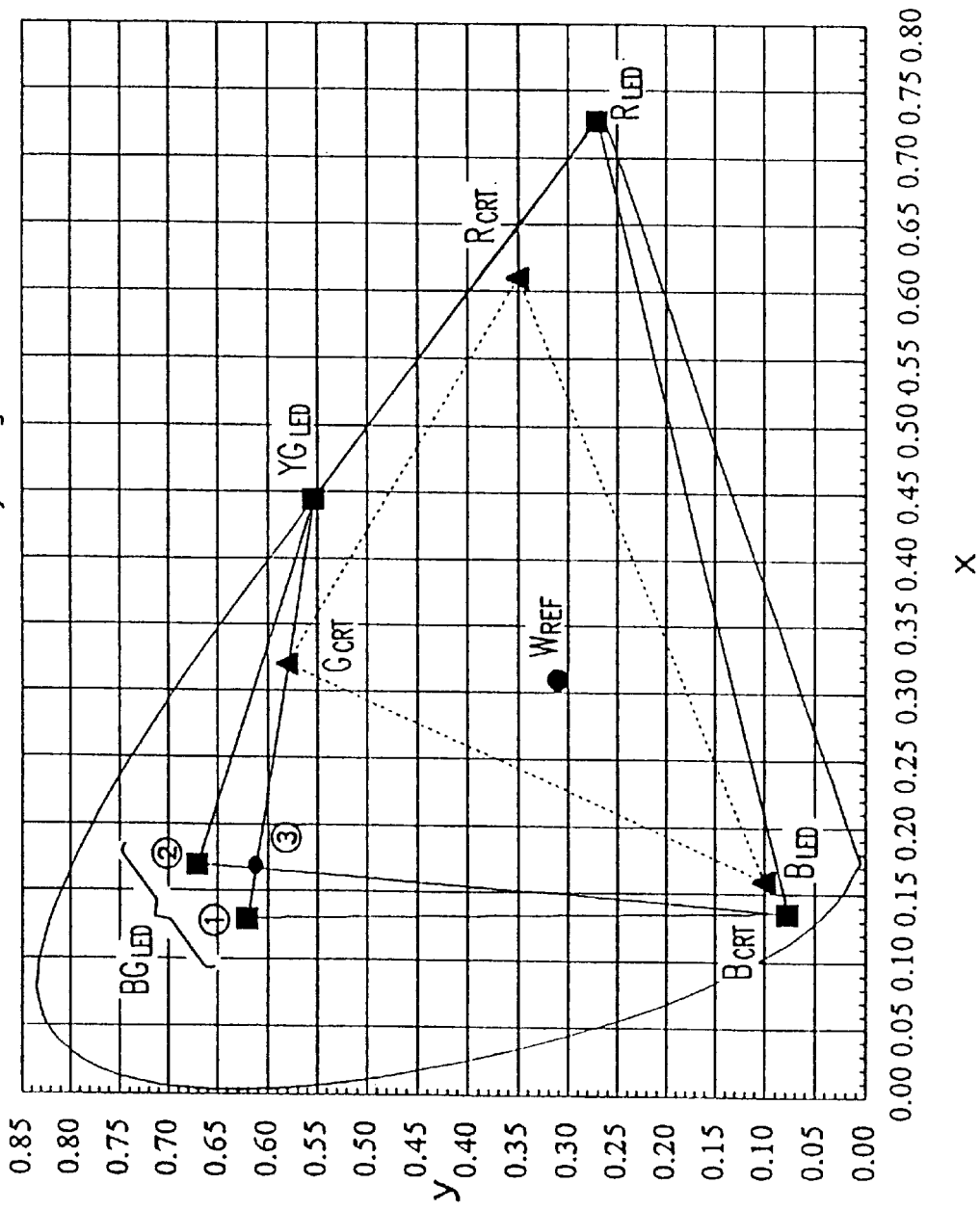
FIG. 7 is a CIE chromaticity diagram showing a change in a color production region when there is a variation in a color produced by a blue-green LED BG.

Such an effect will be described taking a blue-green LED BG as an example. As shown in FIG. 7, when an LED BG1 which produces a color at a position (represented by chromaticity coordinates) $\hat{1}$ is replaced by a different LED BG2 which produces a color at a position $\hat{2}$, the color production region of the light-emitting block changes from a region having vertices at points $R_{LED}$, $YG_{LED}$, $\hat{1}$ and $B_{LED}$ to a region having vertices at points $R_{LED}$, $YG_{LED}$, $\hat{2}$ and $B_{LED}$. Such a replacement causes a region having vertices at points $\hat{2}$, $\hat{3}$ and $YG_{LED}$ to be included in the color production region but causes a region having vertices at points $\hat{1}$, $\hat{3}$ and $B_{LED}$ to be excluded. Accordingly, each of display devices incorporating the LED BG1 or the LED BG2 will produce different colors from each other especially in the vicinity of the basic colors $\hat{1}$ and $\hat{2}$. The above-described effect may equally apply to the cases of LEDs of other colors. In such a manner, different colors may be produced in different display devices even in the case where same signals are input thereto.

Figures 8A, 8B:
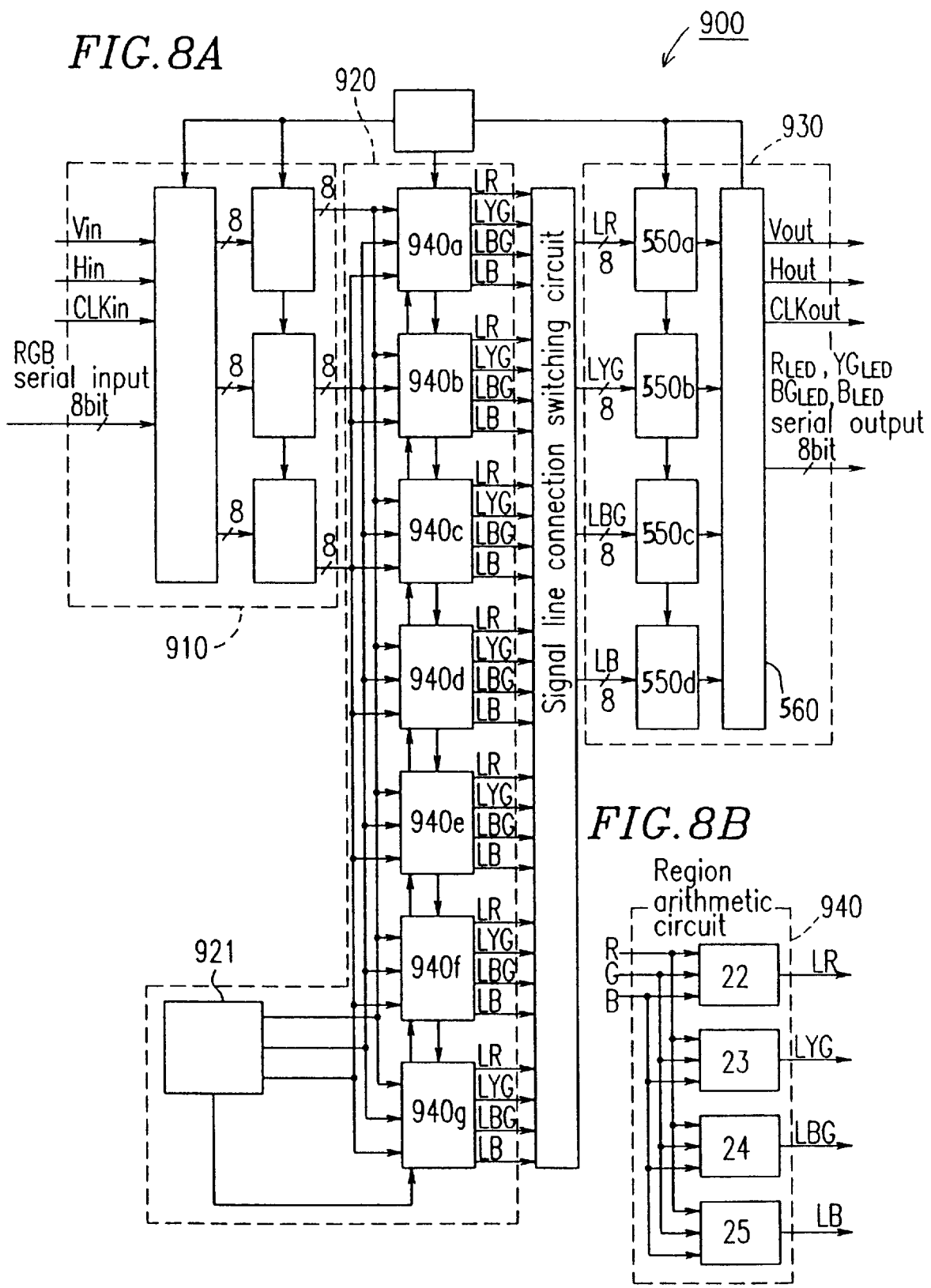
FIGS. 8A and 8B are schematic views showing circuits included in a display device according to a third example.

A circuit section 900 shown in FIG. 8A can exhibit a color production region close to that exhibited by a CRT and at the same time suppress a variation in colors produced by different LEDs. The circuit section 900 has four different LEDs similar to those described in the second example. The circuit section 900 is different from the circuit section 500 in that a color arithmetic circuit 920 uses seven reference colors that are different from the four basic colors. The circuit blocks with the reference numerals 550a to 550d and 560 shown in FIG. 8A are the same as those with the reference numerals 550a to 550d and 560 shown in FIG. 5.

The circuit section 900 includes an input processor 910, a color arithmetic circuit 920 and an ON/OFF controller 930. The input processor 910 receives an input data representing a combination ratio of $R_{CRT}$, $G_{CRT}$ and $B_{CRT}$ and outputs the input data to the color arithmetica circuit 920. The color arithmetic circuit 920 converts the input data into an output data representing a combination ratio of four basic colors and outputs the output data to the ON/OFF controller 930. The ON/OFF controller 930 controls ON/OFF states of each of the four LEDs included in the light-emitting block 5 based on the received output data.

Figure 9:
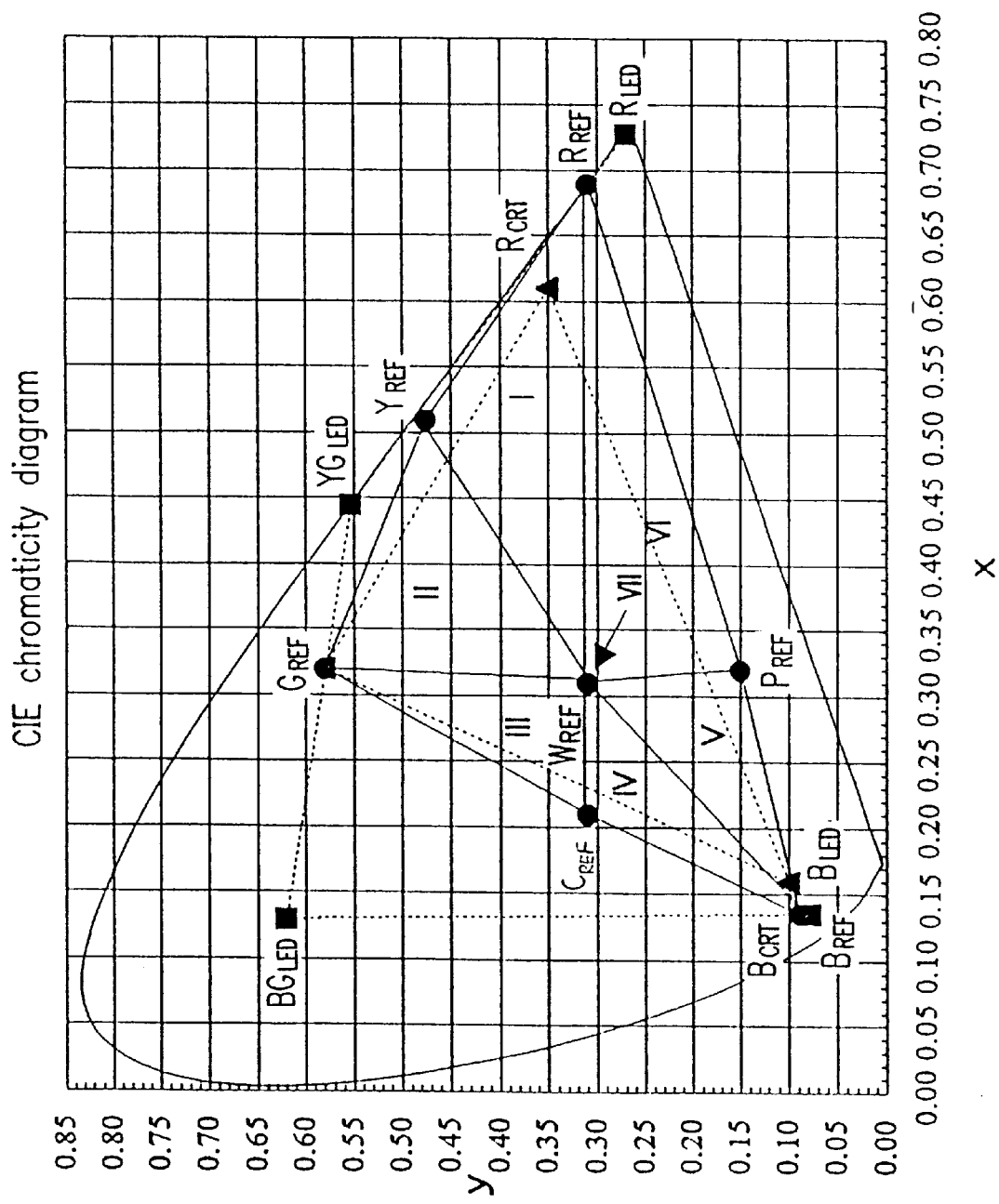
FIG. 9 is a CIE chromaticity diagram showing a color production region of the display device according to the third example of the present invention.

The color arithmetic circuit 920 determines seven reference colors by combining the four basic colors. Specifically, as shown in a chromaticity diagram in FIG. 9, these seven reference colors are $R_{REF}$ (red), $Y_{REF}$ (yellow), $G_{REF}$ (green), $C_{REF}$ (light blue), $B_{REF}$ (blue), $P_{REF}$ (purple) and $W_{REF}$ (white). These seven reference colors are similar to colors exhibited by a CRT which are visually favorable colors. The color arithmetic circuit 920 uses these seven reference colors so as to define a color production region of the light-emitting block 5. Moreover, as shown in FIG. 9, the color arithmetic circuit 920 divides the color production region so as to define six regions I to VI each defined by $W_{REF}$ and two reference colors other than $W_{REF}$. Furthermore, point $W_{REF}$ itself is also considered as one region, i.e., a region VII.

The structure and the function of the color arithmetic circuit 920 will be described in more detail. The color arithmetic circuit 920 includes seven region-arithmetic circuits 940a to 940g and a color comparator 921. The color comparator 921 compares three signals forming the input data. By doing so, the color comparator 921 determines which one of the regions I to VII shown in the chromaticity diagram in FIG. 9 is a region where a color represented by the input data belongs.

Each of the region-arithmetic circuits 940a to 940g is formed so as to correspond to each of the regions I to VII, respectively. Each of the region-arithmetic circuits 940a to 940g stores a unique data representing a combination ratio of the four basic colors (i.e., an emission intensity ratio of the four LEDs), namely, $R_{LED}$, $YG_{LED}$, $BG_{LED}$ and $B_{LED}$ for exhibiting the seven reference colors. Each of the region-arithmetic circuits 940a to 940g further stores formulae for converting the input data, based on the reference colors, into a data representing a combination ratio of the four basic colors. The region-arithmetic circuits 940a to 940g provide an output data for the four basic colors based on the formulae. These formulae are determined for each of the regions I to VII.

As shown in FIG. 8B, each of the region-arithmetic circuits 940a to 940g includes a red signal arithmetic circuit 22, a blue-green signal arithmetic circuit 23, a yellow-green signal arithmetic circuit 24 and a blue signal arithmetic circuit 25 shown in FIG. 3.

Input data representing $R_{CRT}$, $G_{CRT}$ and $B_{CRT}$ are converted into output data representing a combination ratio of $R_{REF}$, $YG_{REF}$, $BG_{REF}$ and $B_{REF}$ as follows. When the input data represents a monochromatic red color ($R_{CRT}$), one of the region-arithmetic circuits performs a calculation such that a light-emitting block 5 exhibits a color represented by a point lying on a line extending between the reference color $W_{REF}$ and the reference color $R_{REF}$. By similar calculation, when the input data represents a monochromatic green color ($G_{CRT}$), the light-emitting block 5 exhibits a color represented by a point lying on a line between the reference color $W_{REF}$ and the reference color $G_{REF}$. When the input data represent a monochromatic blue color ($B_{CRT}$), the light-emitting block exhibits a color represented by a point lying on a line extending between the reference color $W_{REF}$ and the reference color $B_{REF}$. In the case where the input data represents $R_{CRT}:G_{CRT}=1:1$, one of the region-arithmetic circuits performs calculation such that the light-emitting block 5 exhibits a color represented by a point lying on a line extending between the reference color $W_{REF}$ and the reference color $Y_{REF}$. Similarly, when the input data represents $G_{CRT}:B_{CRT}=1:1$, the light-emitting block exhibits a color represented by a point lying on a line extending between the reference color WRD and the reference color $C_{REF}$. Furthermore, when the input data represents $R_{CRT}:G_{CRT}:B_{CRT}=1:1:1$, the light-emitting block exhibits a color at point $W_{REF}$.

Hereinafter, an example of calculation performed by the color arithmetic circuit 920 used in the present example will be described. The emission intensity of each of the four LEDS for producing a color represented by an input data can be calculated by the following formulae.

IR, IG and IB each refer to a signal input to the color arithmetic circuit 920, and LR, LYG, LBG and LB each refer to a signal output from a converter. The color comparator 921 determines the relative magnitude of values represented by the input signals IR, IG and IB, and determines which one of the regions I to VII is a region where as a region where the color represented by the input RGB signals belongs, based on a conversion table shown in Table 1.

TABLE 1

| Region | Determination | | |
|---|---|---|---|
| | IR-IG | IG-IB | IB-IR |
| I | ≧0 | ≧0 | — |
| II | — | ≧0 | — |

TABLE 1-continued

| Region | Determination | | |
|---|---|---|---|
| | IR-IG | IG-IB | IB-IR |
| III | — | ≥0 | ≥0 |
| IV | — | — | ≥0 |
| V | ≥0 | — | ≥0 |
| VI | ≥0 | — | — |
| VII | 0 | 0 | 0 |

—: No determination

The combination ratios of the basic colors (i.e., the emission intensity ratio of the four LEDs) for exhibiting the seven reference colors are shown in Table 2.

TABLE 2

| Reference color | $R_{LED}$ | $YG_{LED}$ | $BG_{LED}$ | $B_{LED}$ |
|---|---|---|---|---|
| $R_{REF}$ | Rr | Ryg | Rbg | Rb |
| $Y_{REF}$ | Yr | Yyg | Ybg | Yb |
| $G_{REF}$ | Gr | Gyg | Gbg | Gb |
| $C_{REF}$ | Cr | Cyg | Cbg | Cb |
| $B_{REF}$ | Br | Byg | Bbg | Bb |
| $M_{REF}$ | Mr | Myg | Mbg | Mb |
| $W_{REF}$ | Wr | Wyg | Wbg | Wb |

Arithmetic formulae of regions I to VII for obtaining the output signals are shown as Formulae (1) to (8), where notations X, Y and C1–C3 are substituted with variables shown in Table 3.

·Regions I–VI $$LR = (W_r * C1) + (X_r * C2) + (Z_r * C3) \quad (1)$$

$$LYG = (W_{yg} * C1) + (X_{yg} * C2) + (Z_{yg} * C3) \quad (2)$$

$$LBG = (W_{bg} * C1) + (X_{bg} * C2) + (Z_{bg} * C3) \quad (3)$$

$$LB = (W_b * C1) + (X_b * C2) + (Z_b * C3) \quad (4)$$

·Region VII $$LR = W_r * IR \quad (5)$$

$$LYG = W_{yg} * IG \quad (6)$$

$$LBG = W_{bg} * IG \quad (7)$$

$$LB = W_b * IB \quad (8)$$

TABLE 3

| Region | C1 | X | C2 | Z | C3 |
|---|---|---|---|---|---|
| I | IB | R | IR-IG | Y | IG-IB |
| II | IB | G | IG-IR | Y | IR-IB |
| III | IR | G | IG-IB | C | IB-IR |
| IV | IR | B | IB-IG | C | IG-IR |
| V | IG | B | IB-IR | M | IR-IG |
| VI | IG | R | IR-IB | M | IB-IG |

By using the above-described formulation, for example, arithmetic expressions (9) to (12) in region I are derived from the above Formulae (1) to (4) and the first line of Table 3 as follows.

$$LR = (W_r * IB) + (R_r * (IR-IG)) + (Y_r * (IG-IB)) \quad (9)$$

$$LYG = (W_{yg} * IB) + (R_{yg} * (IR-IG)) + (Y_{yg} * (IG-IB)) \quad (10)$$

$$LBG = (W_{bg} * IB) + (R_{bg} * (IR-IG)) + (Y_{bg} * (IG-IB)) \quad (11)$$

$$LB = (W_b * IB) + (R_b * (IR-IG)) + (Y_b * (IG-IB)) \quad (12)$$

Moreover, arithmetic formulae (13) to (16) in region V are derived from the above formulae (1) to (4) and the fifth line of Table 3 as follows.

$$LR = (W_r * IG) + (B_r * (IB-IR)) + (M_r * (IR-IG)) \quad (13)$$

$$LYG = (W_{yg} * IG) + (B_{yg} * (IB-IR)) + (M_{yg} * (IR-IG)) \quad (14)$$

$$LBG = (W_{bg} * IG) + (B_{bg} * (IB-IR)) + (M_{bg} * (IR-IG)) \quad (15)$$

$$LB = (W_b * IG) + (B_b * (IB-IR)) + (M_b * (IR-IG)) \quad (16)$$

Figure 10:
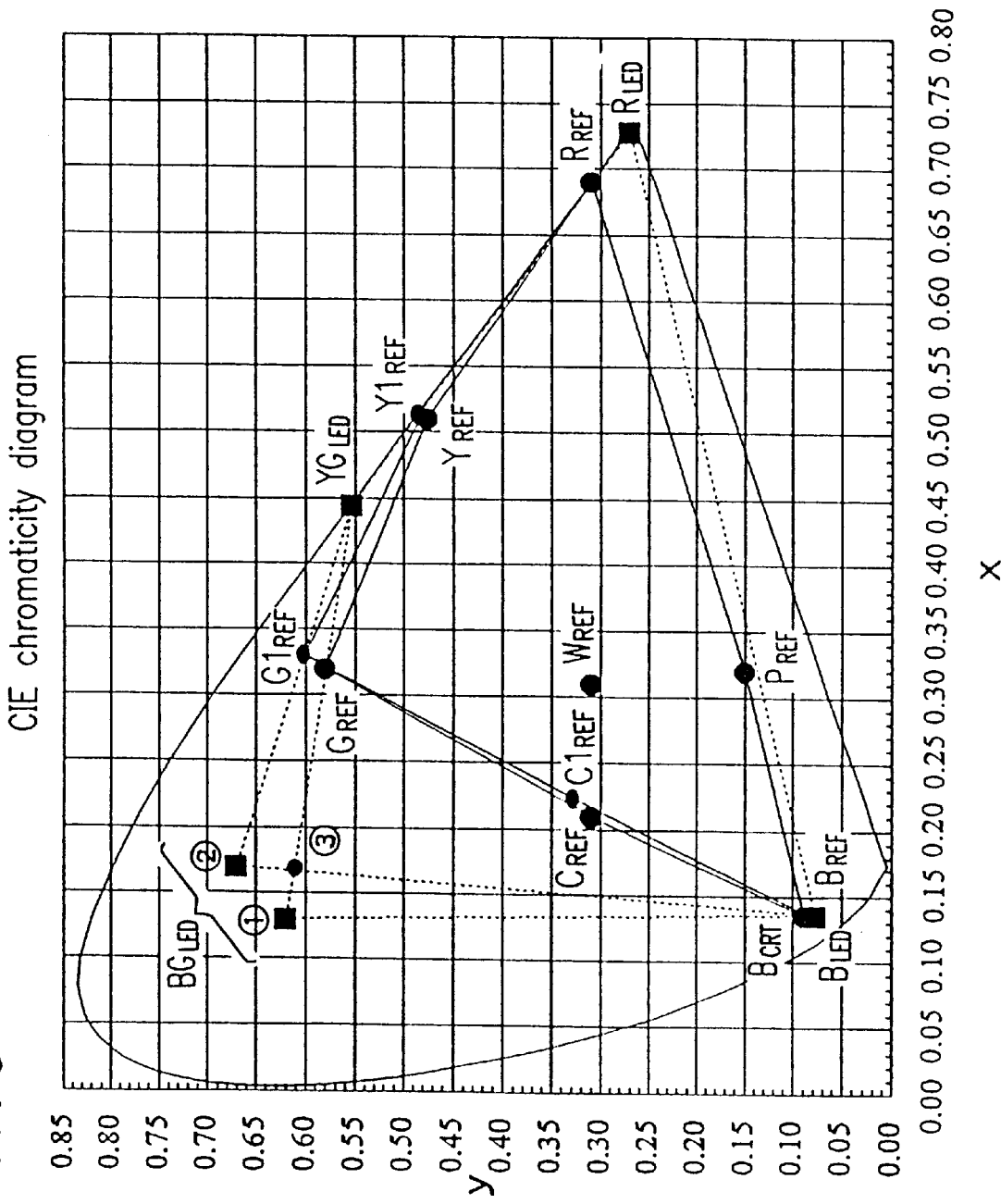
FIG. 10 is a CIE chromaticity diagram showing a change in a color production region when there is a variation in a color produced by a blue-green LED BG.

Hereinafter, changes in the colors due to variation in colors of light emitted by LEDs will be described with reference to FIG. 10. A case will be described where a position (represented by chromaticity coordinates) of a color that is exhibited by an LED BG is shifted from $\hat{1}$ to $\hat{2}$ in a like manner as described with reference to FIG. 7. As shown in FIG. 10, such a shift will cause a position of a reference color $G_{REF}$ ($=G_{CRT}$) to be shifted to $G1_{REF}$ and a position of a reference color $Y_{REF}$ to $Y1_{REF}$. However, as is apparent from the chromaticity diagram, deviation of the chromaticity coordinates of the reference colors is smaller than that of the chromaticity coordinates of the basic colors.

The above-described shift in the color production position of the LED BG causes a region having vertices at points $Y_{REF} Y1_{REF}$, $G_{REF}$ and $G1_{REF}$ to be included but causes a region having vertices at points $G1_{REF}$, $G_{REF}$, $C1_{REF}$, $B_{REF}$ and $C_{REF}$ to be excluded. However, the shift in regions are small enough that they are visually unnoticeable. Similarly, when there are color variations in the basic colors exhibited by LEDs of other colors, the change in the color production region defined by the seven reference colors is also sufficiently small.

EXAMPLE 4

Figure 11:
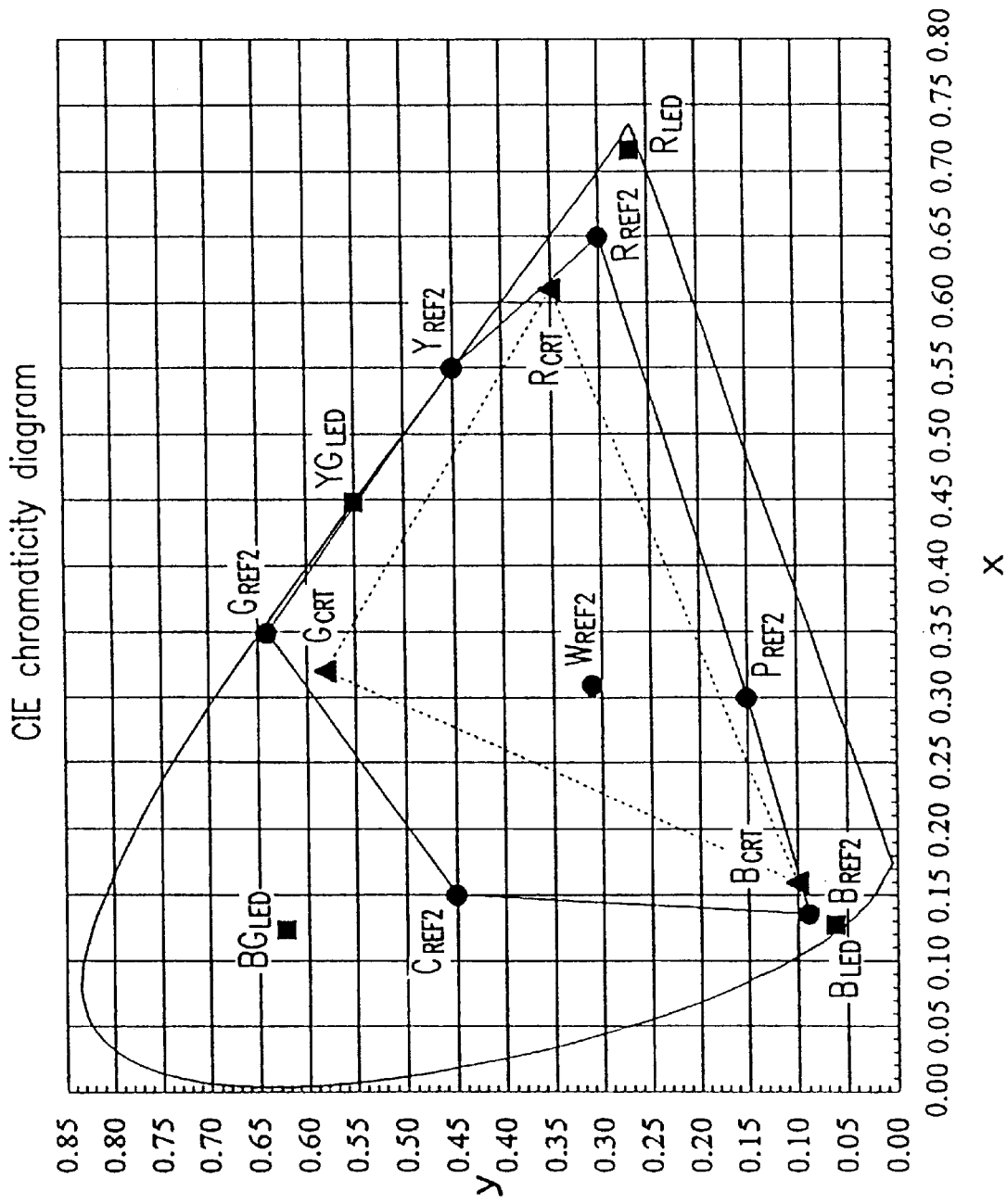
FIG. 11 is a CIE chromaticity diagram showing a color production region of a display device according to a fourth example of the present invention.

FIG. 11 is a chromaticity diagram representing colors exhibited by a display device according to a fourth example of the present invention in which six LEDs of six colors are used. The six LEDs respectively exhibit six basic colors, namely, $R_{Led}$, $YG_{LED}$, $G_{LED}$, $C_{LED}$, $B_{LED}$ and $P_{LED}$.

As shown in FIG. 11, a color production region of a CRT lies within a region defined by the basic colors exhibited by the six LEDs. Thus, the display device according to the fourth example of the present invention can produce colors that are exhibited by the CRT using a light-emitting block 5 having the six LEDs. In order to correspond to the color production characteristics of the CRT, $R_{REF2}$, $Y_{REF2}$, $G_{REF2}$, $C_{REF2}$, $B_{REF2}$, $P_{REF2}$ and $W_{REF2}$ are determined on the chromaticity diagram as seven reference colors. These seven reference colors are suitable for reproducing the color production characteristics of the CRT that the color production region defined by these reference colors encloses the color production region of the CRT. The color production in the color production region defined by the seven reference colors may be controlled by storing, in a region-arithmetic circuit, combination ratios of the six basic colors as specific values for producing the seven reference colors.

The display device according to the third example of the present invention which uses four LEDs in one light-emitting block 5 may also be made to exhibit the colors produced by the CRT. This can be realized by setting the data stored in the color arithmetic circuit 920, that represent the combination ratios of the basic colors for producing the reference colors, to the data representing the combination ratios for producing $R_{REF2}$, $Y_{REF2}$, $G_{REF2}$, $C_{REF2}$, $B_{REF2}$, $P_{REF2}$ and $W_{REF2}$.

The above-described setting is applicable to display devices having any number of basic colors (i.e., any number of LEDs) as long as a region defined by basic colors produced by the LEDs encloses a desired color production region. Accordingly, even two display devices having different LEDs can produce same colors by having common sets of seven reference colors.

An LED display device according to the present invention can produce light having a color close to a pure green color. Accordingly, color reproducibility in a green color region can be enhanced, thereby realizing a well-balanced color display. Furthermore, the LED display device according to the present invention can exhibit a color production region similar to that of a CRT and at the same time is able to suppress undesirable variations in colors produced by LEDs.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A display device, comprising:
   a light-emitting block including a plurality of light-emitting elements for emitting N number of different basic colors;
   an input circuit for receiving an input data representing a first color, a second color and a third color;
   a converter for converting the input data into an output data representing N number of basic colors;
   a controller for controlling ON/OFF states of the plurality of light-emitting elements according to the output data, wherein
   N is an integer of 4 or higher,
   the N number of light-emitting elements are at least four light-emitting diodes which emit light of red, blue, yellow-green and blue-green, respectively, and
   an arrangement of said yellow-green and said blue-green light-emitting diodes provides a pure green color.

2. A display device according to claim 1, wherein:
   a color production region within a region described by N number of vertices of the light-emitting block on a chromaticity diagram has a plurality of regions defined by M number of reference colors;
   each of the M number of reference colors are obtained based on at least one of the N number of basic colors; and
   the converter includes a circuit for selecting one of the plurality of regions in accordance with the input data and a circuit for generating the output data based on at least one of the M number of reference colors corresponding to a selected region within the region described by N number of vertices.

3. A display region according to claim 2, wherein the plurality of regions covers a color production region of a CRT.

4. A display region according to claim 2, wherein at least one of the M number of reference colors corresponding to the selected region within the region described by N number of vertices is a different color than the N number of basic colors.

5. A display device according to claim 2, wherein M is an integer of 4 or higher.

6. A display device according to claim 1, wherein relative positions of said blue-green and said yellow-green light emitting diodes are selected to provide said pure green color.

* * * * *